(12) United States Patent
Xia et al.

(10) Patent No.: US 8,345,369 B2
(45) Date of Patent: Jan. 1, 2013

(54) SYSTEMS AND METHODS FOR DATA RECOVERY USING ENHANCED SYNC MARK LOCATION

(75) Inventors: Haitao Xia, San Jose, CA (US); Shaohua Yang, Santa Clara, CA (US); George Mathew, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 112 days.

(21) Appl. No.: 12/887,317

(22) Filed: Sep. 21, 2010

(65) Prior Publication Data
US 2011/0209026 A1    Aug. 25, 2011

Related U.S. Application Data

(63) Continuation-in-part of application No. 12/712,136, filed on Feb. 24, 2010.

(51) Int. Cl.
*G11B 5/09* (2006.01)
(52) U.S. Cl. ............................... 360/51; 360/48
(58) Field of Classification Search .................. None
See application file for complete search history.

(56) References Cited

U.S. PATENT DOCUMENTS

| | | | | |
|---|---|---|---|---|
| 5,416,760 A * | 5/1995 | Masood et al. | ............. | 369/47.2 |
| 5,802,069 A | 9/1998 | Coulson | | |
| 6,065,149 A | 5/2000 | Yamanaka | | |
| 6,301,679 B1 | 10/2001 | Tan | | |
| 6,557,113 B1 | 4/2003 | Wallentine | | |
| 6,691,263 B2 | 2/2004 | Vasic et al. | | |
| 6,697,977 B2 | 2/2004 | Hyogo | | |
| 6,738,948 B2 | 5/2004 | Dinc et al. | | |
| 6,980,382 B2 | 12/2005 | Hirano et al. | | |
| 7,154,936 B2 | 12/2006 | Bjerke et al. | | |
| 7,168,030 B2 | 1/2007 | Aryoshi | | |
| 7,203,015 B2 | 4/2007 | Sakai et al. | | |
| 7,212,364 B1 * | 5/2007 | Lee | ............. | 360/51 |
| 7,237,173 B2 | 6/2007 | Morita et al. | | |
| 7,254,192 B2 | 8/2007 | Onggosanusi | | |

(Continued)

FOREIGN PATENT DOCUMENTS
JP        10-145243          5/1998
(Continued)

OTHER PUBLICATIONS

U.S. Appl. No. 12/399,679, filed Mar. 6, 2009, Dziak, Scott.
(Continued)

*Primary Examiner* — Regina N Holder
(74) *Attorney, Agent, or Firm* — Hamilton DeSanctis & Cha

(57) ABSTRACT

Various embodiments of the present invention provide systems and methods for identifying a reproducible location on a storage medium. As an example, a circuit is discussed that includes a data storage circuit, a pattern comparison circuit, and a threshold comparison circuit. The data storage circuit is operable to store a first set of data samples corresponding to a region of interest. The pattern comparison circuit is operable to compare a subset of the first set of data samples with a subset of a second set of data samples corresponding to the region of interest. The pattern comparison circuit is operable to yield a match value corresponding to a degree of similarity between the first set of data samples with the subset of a second set of data samples. The threshold comparison circuit is operable to indicate an anchor point based at least in part on the magnitude of the match value relative to a threshold value.

21 Claims, 9 Drawing Sheets

U.S. PATENT DOCUMENTS

| | | | |
|---|---|---|---|
| 7,257,172 | B2 | 8/2007 | Okamoto et al. |
| 7,359,313 | B2 | 4/2008 | Chan et al. |
| 7,441,174 | B2 | 10/2008 | Li et al. |
| 7,652,966 | B2 | 1/2010 | Kadokawa |
| 7,688,915 | B2 | 3/2010 | Tanrikulu et al. |
| 7,733,590 | B2 * | 6/2010 | Motwani .................... 360/51 |
| 7,752,523 | B1 | 7/2010 | Chaichanavong |
| 7,974,034 | B1 * | 7/2011 | Han et al. .................. 360/51 |
| 2003/0063405 | A1 | 4/2003 | Jin et al. |
| 2007/0061687 | A1 | 3/2007 | Hwang |
| 2008/0168315 | A1 | 7/2008 | Mead |
| 2008/0276156 | A1 | 11/2008 | Gunnam |
| 2008/0301521 | A1 | 12/2008 | Gunnam |
| 2009/0235116 | A1 | 9/2009 | Tan et al. |
| 2009/0235146 | A1 | 9/2009 | Tan et al. |
| 2009/0268575 | A1 | 10/2009 | Tan et al. |
| 2009/0268848 | A1 | 10/2009 | Tan et al. |
| 2009/0271670 | A1 | 10/2009 | Tan et al. |
| 2010/0042877 | A1 | 2/2010 | Tan |
| 2010/0050043 | A1 | 2/2010 | Valentin Savin |
| 2010/0074078 | A1 | 3/2010 | Cao et al. |
| 2010/0115209 | A1 | 5/2010 | Lee et al. |
| 2010/0226031 | A1 | 9/2010 | Dziak |
| 2010/0226033 | A1 | 9/2010 | Tan et al. |
| 2010/0229031 | A1 | 9/2010 | Tan et al. |

FOREIGN PATENT DOCUMENTS

| | | |
|---|---|---|
| JP | 2007-087529 | 4/2007 |

OTHER PUBLICATIONS

U.S. Appl. No. 12/399,713, filed Mar. 6, 2009, Weijun Tan.
U.S. Appl. No. 12/399,750, filed Mar. 6, 2009, Weijun Tan.
U.S. Appl. No. 12/425,626, filed Apr. 17, 2009, Yang et al.
U.S. Appl. No. 12/425,824, filed Apr. 17, 2009, Shaohua Yang.
U.S. Appl. No. 12/556,180, filed Sep. 9, 2009, Tan et al.
U.S. Appl. No. 12/712,136, filed Feb. 24, 2010, Mathew et al.
U.S. Appl. No. 12/901,791, filed Oct. 11, 2010, Yang, Shaohua.
Bagul,: "Assessment of current health and remaining useful life of hard disk drives" [online] Jan. 1, 2009 [retr. on Oct. 14, 2010] Retr. from the internet:<URL;htt://iris,lib.neu.edu.
Galbraith et al, "Iterative Detection Read Channel Tech. in Hard Disk Drives" [online] Oct. 1, 2008 Retr. from Internet:<URL: http://www.hitachigst.com/tech.
Kavcic et al., "A Signal-Dependent Autoregressive Channel Model", IEEE Transactions on Magnetics, vol. 35, No. 5, Sep. 1999 pp. 2316-2318.
ECMA: Std. Info. & Comm. Systems: "Std. ECMA-272: 120mm DVD R-W Disk (DVD-RAM)" Std. ECMA, , No. 272, Feb. 1, 1998, p. 43-51, XP002114221 paragraph [17.4]-[17.5].
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)" (dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.

* cited by examiner

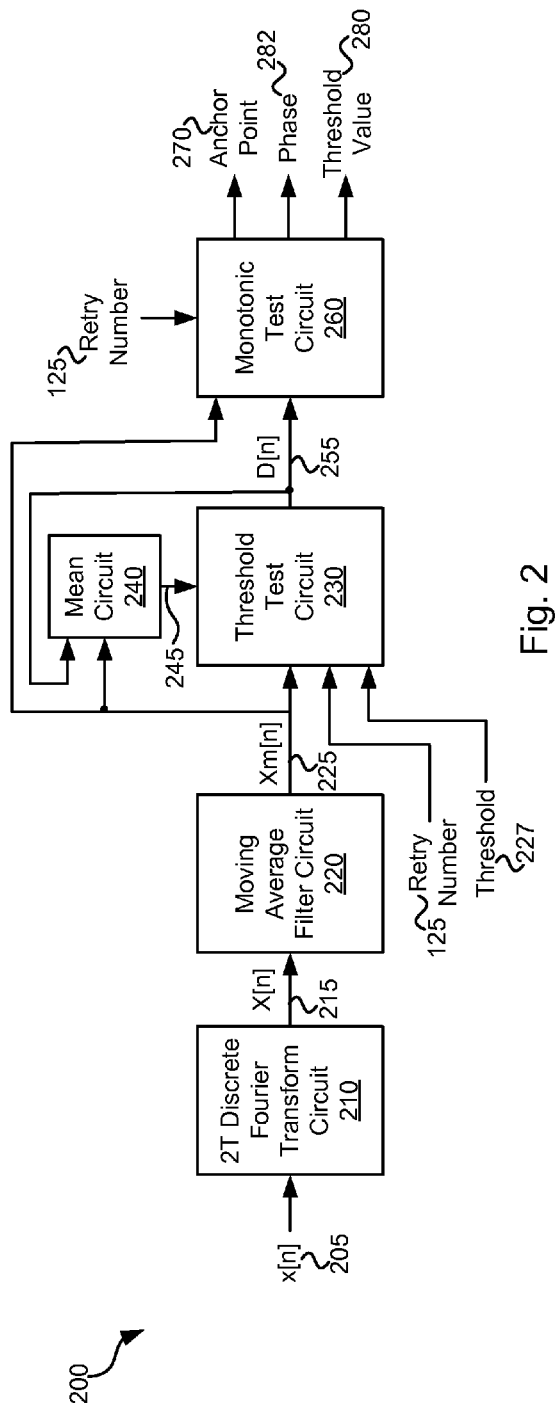
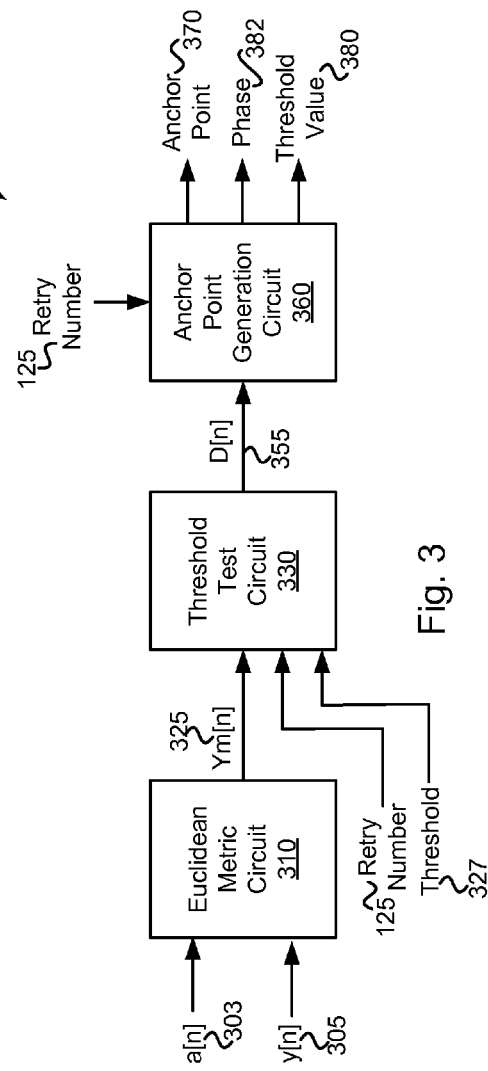
Fig. 2
Fig. 3

SYSTEMS AND METHODS FOR DATA RECOVERY USING ENHANCED SYNC MARK LOCATION

CROSS REFERENCE TO RELATED APPLICATIONS

The present application is a continuation in part of U.S. patent application Ser. No. 12/712,136 entitled "Systems and Methods for Data Recovery" and filed by Mathew et al. on Feb. 24, 2010. The entirety of the aforementioned reference is incorporated herein by reference for all purposes.

BACKGROUND OF THE INVENTION

The present inventions are related to systems and methods for identifying a reproducible location on a storage medium, and more particularly to systems and methods for identifying a reproducible location on a storage medium based on a waveform correlation.

A hard disk typically includes a number of user data regions that are preceded by synchronization information including a preamble and a data sync pattern. The preamble is used to synchronize phase and frequency during an asynchronous read, and the data sync pattern is used to define the starting point of a series of user data. In operation, a circuit searches for the data sync pattern and processes a series of subsequently received data samples derived at a location relative to the data sync pattern. Occasionally the data sync pattern is missed resulting in a retry where one or more search approaches are used to identify the data sync pattern. Such search approaches are often costly in terms of circuitry and time. Further, in some cases, the search approaches are not capable of identifying the data sync mark resulting in the loss of data.

Hence, for at least the aforementioned reasons, there exists a need in the art for advanced systems and methods for recovering data from a storage medium.

BRIEF SUMMARY OF THE INVENTION

The present inventions are related to systems and methods for identifying a reproducible location on a storage medium, and more particularly to systems and methods for identifying a reproducible location on a storage medium based on a waveform correlation.

Various embodiments of the present invention provide circuits for identifying a reproducible location on a storage medium. Such circuits include a data storage circuit, a pattern comparison circuit, and a threshold comparison circuit. The data storage circuit is operable to store a first set of data samples corresponding to a region of interest. The pattern comparison circuit is operable to compare a subset of the first set of data samples with a subset of a second set of data samples corresponding to the region of interest. The pattern comparison circuit is operable to yield a match value corresponding to a degree of similarity between the first set of data samples with the subset of a second set of data samples. The threshold comparison circuit is operable to indicate an anchor point based at least in part on the magnitude of the match value relative to a threshold value. In some instances of the aforementioned embodiments, the threshold value is programmable.

In various embodiments of the present invention, the pattern comparison circuit calculates a Euclidean distance between the subset of the first set of data samples and the subset of a second set of data samples. In such cases, the Euclidean distance may be calculated consistent with the following equation:

$$\text{Match Value} = \sum_{k=0}^{n} (X_{segment}[k] - Y_{segment}[k])^2,$$

where the subset of the first set of data samples is n bits in length, where $X_{segment}[k]$ is the subset of the first set of data samples, and where $Y_{segment}[k]$ is the subset of the second set of data samples.

In one or more instances of the aforementioned embodiments, that circuit further includes a data processing circuit that is operable to process a sector of data samples using a forced sync mark that is a fixed distance from the anchor point. In some such instances, the circuit further includes a sync forcing circuit that is operable to repeatedly identify forced sync marks whenever the data processing circuit fails to converge, and to store the forced sync mark when the data processing circuit converges. In some cases, the circuit further includes a storage medium maintaining the sector of data samples and a data buffer operable to store the forced sync mark that is usable on subsequent reads from the storage medium to indicate the beginning of a decodable data set on the storage medium. The sector of data samples includes the first set of data samples.

Other embodiments of the present invention provide methods for identifying a reproducible location on a storage medium. The methods include: receiving a series of data samples derived from a storage medium; storing a first subset of the data samples to a memory, wherein the first set of data samples corresponds to a region of interest; comparing a second subset of the data samples with the first subset of the data samples to yield a match value corresponding to a degree of similarity between the first subset of the data samples and the second subset of the data samples; and identifying an anchor point on the storage medium based at least in part on the match value. The second subset of the data samples corresponds to at least a portion of the region of interest.

In some instances of the aforementioned embodiments, identifying the anchor point includes comparing the match value with a threshold value. In such instances, the anchor point corresponds to the pattern in the first subset of the data samples where the match value is less than the threshold value. In some cases, the methods further include programming the threshold value.

In one or more instances of the aforementioned embodiments, the methods further include applying a data processing algorithm to the series of data samples using the anchor point as a reference for the beginning of a decodable data set. In some such instances, the data processing algorithm converges resulting in storing a forced sync mark in a memory. The forced sync mark indicates a location relative to the anchor point that is usable on subsequent reads from the storage medium to indicate the beginning of a decodable data set on the storage medium. In some cases, the data processing algorithm includes a low density parity check algorithm. In various cases, the data processing algorithm includes a data detection algorithm such as, for example, a Viterbi algorithm detection process or a maximum a posteriori algorithm process.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 2 shows a discrete Fourier transform based anchor location circuit in accordance with various embodiments of the present invention;

FIG. 3 shows an end of preamble based anchor location circuit in accordance with other embodiments of the present invention;

DETAILED DESCRIPTION OF THE INVENTION

Figure 1A:
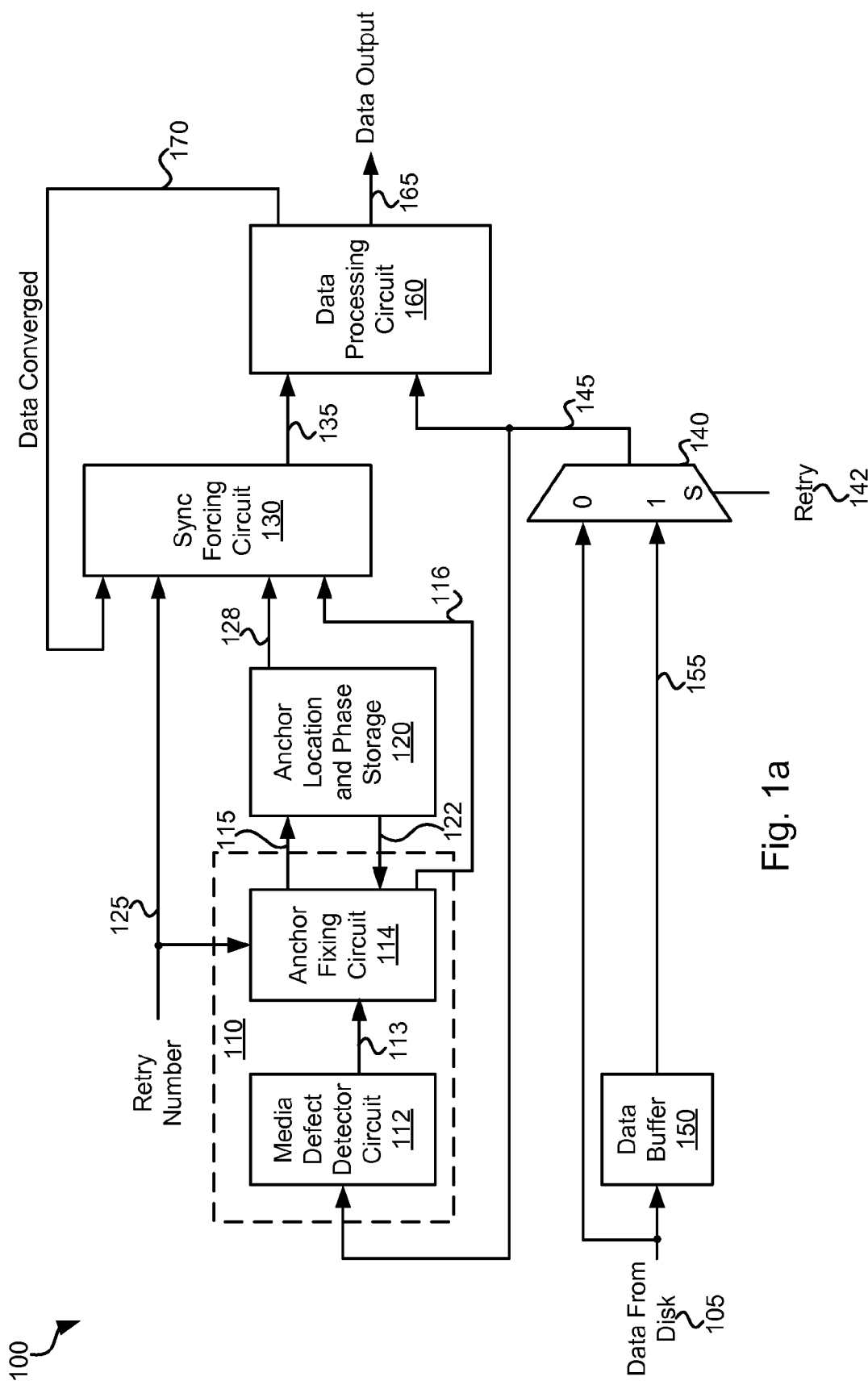
FIG. 1a depicts a read channel circuit including anchor point circuitry and data sync mark forcing circuitry in accordance with various embodiments of the present invention.

The present inventions are related to systems and methods for identifying a reproducible location on a storage medium, and more particularly to systems and methods for identifying a reproducible location on a storage medium based on a waveform correlation.

Various embodiments of the present invention provide forced data sync marks that may be used in place of original data sync marks that cannot be detected on a storage medium due to a media defect on the storage medium or some other anomaly. In one particular case, the forced data sync mark is located a defined distance from an identified waveform occurring within a window of interest. As media defects do not move and generally result in a reproducible waveform, albeit not a waveform corresponding to data written near the region of the media defect, the location of the waveform is reproducible. Because the location of the waveform is reproducible and the forced data sync mark is located relative to the waveform, the forced data sync mark is also reproducible. The reproducibility of the forced data sync mark allows for a forced data sync mark to be tested to determine its utility and once proven to be useful, the forced data sync mark may be used in the future to read data from the storage medium.

Other embodiments of the present invention provide forced data sync marks that may be used in place of original data sync marks that cannot be detected on a storage medium due to a media defect on the storage medium or some other anomaly. In one particular case, the forced data sync mark is located a defined distance from a media defect on the storage medium. As media defects do not move, the location of the media defect is reproducible. Because the location of the media defect is reproducible and the forced data sync mark is located relative to the media defect, the forced data sync mark is also reproducible. The reproducibility of the forced data sync mark allows for a forced data sync mark to be tested to determine its utility and once proven to be useful, the forced data sync mark may be used in the future to read data from the storage medium.

Some embodiments of the present invention provide circuits for identifying a reproducible location on a storage medium. Such circuits include a media defect detector and an anchor fixing circuit. As used herein, the phrase "media defect detector" is used in its broadest sense to mean any circuit, device or system that is capable of indicating a location of a media defect on a storage medium. As used herein, the phrase "anchor fixing circuit" is used in its broadest sense to mean any circuit, device or system that is capable of identifying a reproducible location relative to an identified media defect.

In some instances of the aforementioned embodiments, the circuit may further include a data processing circuit. As used herein, the phrase "data processing circuit" is used in its broadest sense to mean any circuit that is capable of applying a defined process to a data input to yield a data output. In some cases, the defined process is a data detector algorithm and/or a data decoder algorithm. In one particular case, a low density parity check decoder algorithm is used that converges on an appropriate result when the data input starts from a known location and does not have too many error bits. Based upon the disclosure provided herein, one of ordinary skill in the art will recognize a variety of data decoder and/or data detector circuits that may be used in relation to different embodiments of the present invention.

The data processing circuit may receive data that begins with a forced data sync mark in place of an original data sync mark that was not detected. Where the forced data sync mark is in the same location as the original data sync mark, the data processing circuit should converge when there are not too many data errors. In contrast, where the forced data sync mark is not in the same location as the original data sync mark, it is highly unlikely that the data processing circuit will converge. Thus, after identifying an anchor location corresponding to a media defect, some embodiments of the present invention repeatedly locate a forced data sync mark at different locations relative to the anchor location until the data processing circuit converges. Where the data processing circuit converges, it is assumed that the forced data sync mark has been located at the appropriate location. Once a forced data sync mark is identified that results in data convergence by the data processing circuit, the location of the forced data sync mark is stored to a buffer where it can be used on the next read of the storage medium in place of the undetectable original data sync mark.

Turning to FIG. 1a, a read channel circuit 100 including anchor point circuitry and data sync mark forcing circuitry is shown in accordance with various embodiments of the present invention. Read channel circuit 100 includes an anchor location circuit 110. Anchor location circuit 110 has a media defect detector circuit 112 that receives data 105 derived from a disk or other storage medium via a multiplexer 140 as an output 145. In some cases, data 105 is a series of digital samples that may be received, for example, from an analog processing circuit (not shown) that is responsible for sensing information from a storage medium, filtering the information, and converting the information to a series of corresponding digital samples. Based upon the disclosure provided herein, one of ordinary skill in the art will recognize a variety of sources for data 105 and pre-processing circuitry.

Media defect detector circuit 112 is operable to receive multiplexer output 145 and to provide a media defect output 113 to an anchor fixing circuit 114. Media defect output 113 is asserted over a period corresponding to a detected defect on the medium from which data 105 was derived. Media defect detector circuit 112 may be any media defect detector circuit known in the art that is capable of providing an output indicating the occurrence of a defect on the medium from which data 105 was derived. Anchor fixing circuit 114 applies a filtering algorithm to media defect output 113 to determine whether the currently identified media defect is sufficiently reliable, along with the location and phase of the identified media defect. Where the currently identified media defect indicated by media defect output 113 is not sufficiently reliable, it is ignored and the next media defect is awaited. Alternatively, where the currently identified media defect indicated by media defect output 113 is sufficiently reliable, anchor fixing circuit 114 provides a defect and phase location output 115 to an anchor location and phase storage circuit 120. Anchor location and phase storage circuit 120 stores the received phase and location to be used as an anchor point for repeated forced data sync marks.

Anchor location and phase storage 120 provides a phase output 122 to anchor fixing circuit 114. Anytime a second or later retry is being processed as indicated by a retry number 125, anchor fixing circuit 114 only looks for the previously identified anchor point using the previously determined phase provided as phase output 122. Anchor location and phase storage 120 provides an anchor and phase output 128 to a sync forcing circuit 130 that provides a forced data sync output 135 relative to the received anchor and phase output 128.

Data 105 is also provided to a data buffer 150 that is of sufficient size to store at least one full encoded data set for decoding by a data processing circuit 160. As data 105 is initially received, a retry input 142 is set as a logic '0' such that data 105 is provided via a multiplexer 140 as a multiplexed output 145 to data processing circuit 160 and to media defect detector circuit 112. On this initial processing pass where the original data sync mark is detected, data processing circuit 160 processes data 105 to yield a data output 165. Alternatively, where the original data sync mark is not detected, a subsequent pass provides buffered data 155 from data buffer 150 to data processing circuit 160 and media defect detector circuit 112 via multiplexer 140.

On all retry passes as indicated by retry number 125, sync forcing circuit 130 provides a forced data sync mark 135 to data processing circuit 160. Forced data sync mark 135 is used on retry passes to indicate a reproducible beginning of the data in data buffer 150 that is to be processed by data processing circuit 160. Where data processing circuit 160 converges, the result is provided as data output 165 and a data converged output 170 is asserted indicating that the previously forced data sync mark worked. In such a case, sync forcing circuit 130 stores the previously forced data sync mark as a location relative to the anchor point. This location information can be used on subsequent accesses to the corresponding region of the storage medium. At this point, the retry process completes as the data was found.

Alternatively, where data processing circuit 160 does not converge, data converged signal 170 indicates the failure to converge to sync forcing circuit 130. In response, sync forcing circuit 130 forces a subsequent forced data sync mark a greater distance from the anchor point than the previously forced data sync mark. The data from data buffer 150 is re-processed by data processing circuit 160 as previously described. This process of repeatedly placing forced data sync marks at succeeding different distances from the previously identified anchor location received as part of output 128 and retrying the processing by data processing circuit 160 continues until either a time out condition is met or until a valid data sync mark location is identified (i.e., until data processing circuit 160 converges).

Figure 1B:
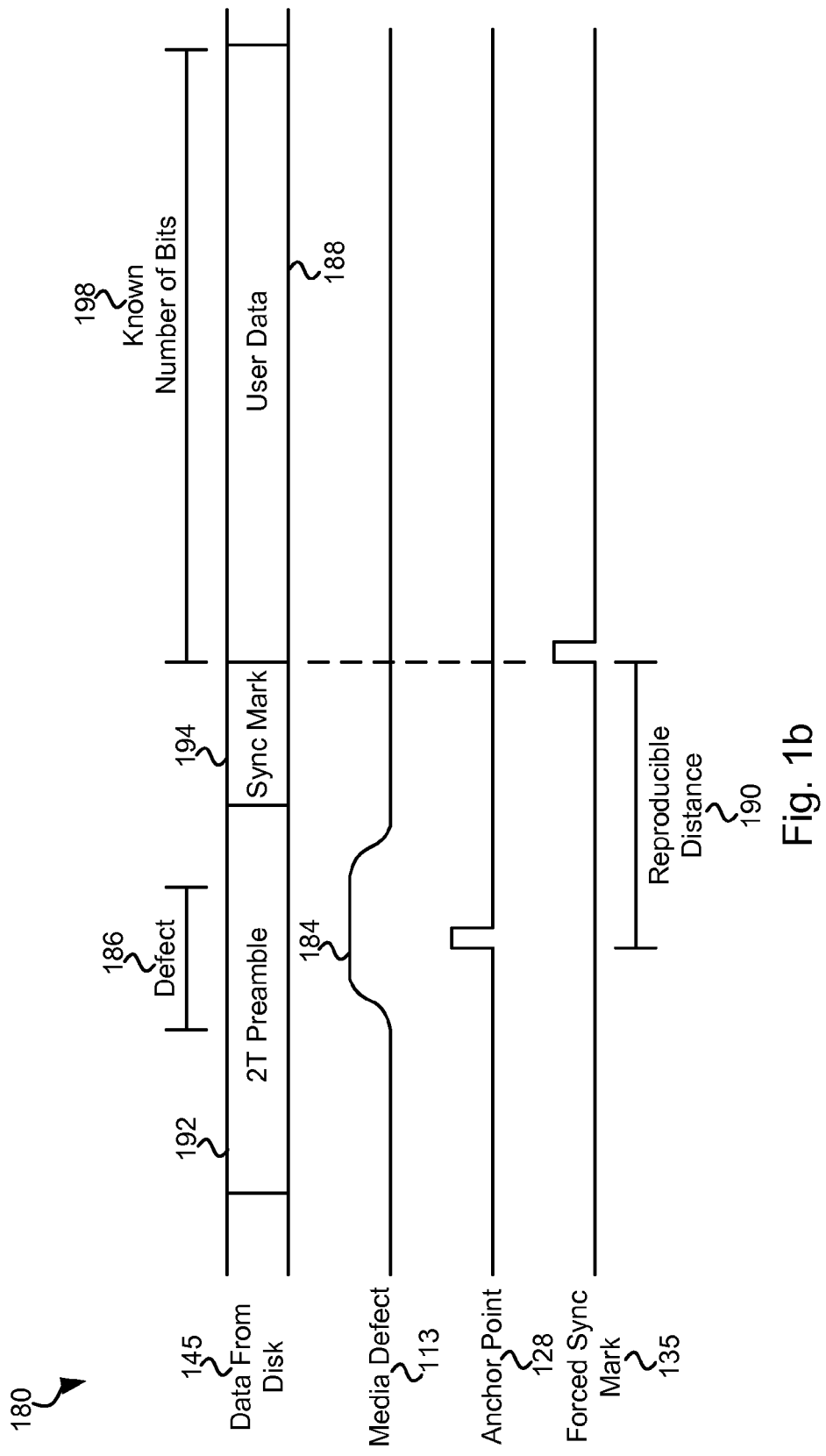
FIG. 1b is a timing diagram depicting an example operation of the read channel circuit of FIG. 1a in accordance with some embodiments of the present invention.

Turning to FIG. 1b, a timing diagram 180 depicts an example operation of read channel circuit 100 in accordance with some embodiments of the present invention. Following timing diagram 180, data from the disk (i.e., output 145 from multiplexer 140) includes a 2T preamble 192 as is known in the art. 2T preamble 192 is a repetitive signal that may be used to synchronize the phase and frequency of a subsequent original data sync mark 194 and user data 188. User data is a known number of bits 198 that begins after sync mark 194. In some embodiments, known number of bits 198 is 4K bits. As shown, a media defect 186 occurs at a location where 2T preamble 192 is stored on the medium. It should be noted that read channel circuit will work where media defect 186 occurs anywhere in 2T preamble 192 and/or original data sync mark 194.

Media defect output 113 is asserted during a period 184 that corresponds to media defect 186. Once it is determined that the identified media defect is sufficiently reliable, anchor point 128 is stored for use in relation to forcing data sync marks. As shown, forced sync mark 135 eventually is placed at a location corresponding to original data sync mark 194. The location of forced sync mark 135 is a reproducible distance 190 from anchor point 128. As such, forced data sync mark 135 is stored and can be reproduced on subsequent accesses of user data 188. What is not shown is a number of forced sync marks that were tried. Because these earlier tried forced sync marks were not correct, data processing circuit 160 fails to converge resulting in the placement and try of a subsequent forced data sync mark. This process is repeated until the shown forced sync mark 135 corresponding to reproducible distance 190 from anchor point 128 is located.

Turning to FIG. 2, a discrete Fourier transform based anchor location circuit 200 is shown in accordance with various embodiments of the present invention. Anchor location circuit 200 may be used in place of anchor location circuit 110 of FIG. 1. Anchor location circuit 200 includes a discrete Fourier transform circuit 210 that is tuned to a 2T frequency. Discrete Fourier transform circuit 210 may be any discrete Fourier transform circuit known in the art. As is known in the art, the 2T frequency is the fundamental frequency of the preamble pattern (i.e., '110011001100 . . . ') with a period 4T where T denotes the duration of one bit. Discrete Fourier transform circuit 210 receives a data input 205 (x[n]) and converts data input 205 to a frequency domain output 215 (X[n]). In one particular embodiment, data input 205 may be data output 145 from multiplexer 140 shown in FIG. 1a. Frequency domain output 215 is described by the following equation:

$$X[n] = |x[n-4] - x[n-2] + x[n] - x[n+2]| + |x[n-3] - x[n-1] + x[n+1] - x[n+3]|.$$

A moving average filter circuit 220 receives frequency domain output 215 and performs a moving average that is provided as an average output 225, $X_m[n]$. Moving average filter circuit 220 may be any moving average filter circuit known in the art. In one particular embodiment of the present invention, moving average filter circuit 220 may average four or eight instances of frequency domain output 215 to yield average output 225. Based upon the disclosure provided herein, one of ordinary skill in the art will recognize different numbers of instances of frequency domain output 215 that may be used in calculating average output 225. As an example, moving average filter circuit 220 may include a memory that maintains a defined number of the most recent instances of frequency domain output 215. The following equation describes average output 225:

$$X_m[n] = \frac{1}{\beta} \sum_{i=0}^{N-1} X[n-i],$$

where β is equal to '1' when N is equal to '4', and β is equal to '2' when N is equal to '8'.

A mean output 245, $X_{m,d}[n]$, is generated by a mean circuit 240 where mean output 245 is the mean of average output 225 as described by the following equations:

$$X_{m,d}[n] = X_{m,d}[n-1] + \gamma(X_m[n] - X_{m,d}[n-1]),$$

where a defect output 255 was not asserted on the preceding instance (i.e., D[n−1]='0'); and $$X_{m,d}[n] = X_{m,d}[n-1],$$

where defect output 255 was asserted on the preceding instance (i.e., D[n−1]='1'). A threshold test circuit 230 asserts defect output 255 based upon a comparison of average output 225 with a threshold 227 multiplied by mean output 245. In particular, the following equation describes assertion of defect output 255 by threshold test circuit 230:

$$D[n] = \text{'1' if } X_m[n] \leq threshold \cdot X_{m,d}[n];$$

$$D[n] = \text{'0' otherwise}.$$

Defect output 255 and average output 225 are provided to a monotonic test circuit 260 that tests a detected output to determine if it is sufficiently reliable for establishing an anchor point. Monotonic test circuit 260 effectively tests subsequent data points to determine whether the detected defect condition continues. In particular instances, the detected media defect is considered sufficiently reliable where the following condition is met:

$$Xm[n_0-4+i] > Xm[n_0-2+i] > Xm[n_0+i] > Xm[n_0+2+i],$$

where $n_0$ is the location where the aforementioned monotonic condition (i.e., reliability condition) is first met, and i is a positive integer with $i \in \{0, 1, 2, 3, 4 \ldots\}$. Let $i_0$ be the minimum value of i for which the above mentioned condition holds. Where monotonic test circuit 260 determines that the reliability condition has been met, the location of the determined monotonic condition, given by $n_1 = n_0 + i_0$ is provided as an anchor point 270, and a threshold value 280 at anchor point 270 is provided. Threshold value 280 is determined as:

$$\theta = \frac{Xm[n_1] + Xm[n_1 - 4]}{2}.$$

The quarter rate phase 282, $\phi \in \{0, 1, 2, 3\}$, on which the $n_1$ lies is also noted. In some cases, threshold 227 is programmable.

On subsequent passes (i.e., where retry number 125 indicates the second or later retry), the same process of establishing an anchor point may be used as it is repeatable. However, in some cases of the aforementioned embodiments, for subsequent retries the first defect 215 that satisfies the above described monotonic condition is identified. The starting location of this defect is referred to herein as $k_0$. With this condition met, the sample instant $k_1$ that occurs at the same phase 282 where anchor point 270 was established on the first pass is determined such that $k_1 \geq k_0$. From here it is determined whether the identified point meets the threshold value 280 that was established on the initial pass. In particular, the anchor point is described by the following equation:

$$\text{anchor point} = k_1 + 4 \cdot i_1,$$

where $i_1$ is the minimum value of $i \in \{-1, 0, 1\}$ for which the threshold test is met. In particular, the threshold test is described by the following equation:

$$X_m[k_1 + 4 \cdot i] \leq \Theta.$$

Such an approach may require substantially less processing when compared with the approach used to initially establish the anchor point, and in many cases will further guarantee that the original anchor point is found again.

FIG. 3 shows an end of preamble based anchor location circuit 300 in accordance with other embodiments of the present invention. Preamble based anchor location circuit 300 reuses a Euclidean metric circuit 310 that is included in a number of data detection circuits. As is known in the art, Euclidean metric circuit 310 calculates the Euclidean distance between a data input 305 and a baseline 303. In a particular embodiment, data input 305 is data output 145 from multiplexer 140 of FIG. 1. Where the baseline 303 corresponds to the preamble pattern, a Euclidean output 325, $Y_m[n]$, is asserted at a relatively low value when data input 305 is consistent with baseline 303; and Euclidean output 325 is asserted at a relatively high value when data input 305 deviates from baseline 303. Where Euclidean output 325 is asserted at the relatively low level for a substantially long period (e.g., between fourteen to twenty bit periods) followed by an increase in Euclidean value 325, an end of preamble is indicated. Under normal conditions, this end of preamble indicates the start of the original data sync mark. However, where a media defect occurs at a location where the preamble was originally written, the same increase in Euclidean value 325 occurs. Thus, where the decline in Euclidean value 325 is not followed by detection of an original data sync mark, it may be assumed that a reproducible media defect detection occurred. This reproducible media defect detection may be used to fix an anchor point that can be used as the basis of forced data sync marks similar to those discussed above in relation to FIG. 2.

Euclidean value 325 is provided to a threshold test circuit 330. Threshold test circuit 330 compares Euclidean value 325 with a threshold 327. Where Euclidean value 325 is greater than threshold 327, an end of preamble is declared (i.e., a defect output 355, D[n], is asserted). Anchor point generation circuit 360 provides an anchor point 370 that indicates the location, and a threshold value 380 at anchor point 370 is provided. The quarter rate phase 382, $\phi \in \{0, 1, 2, 3\}$, on which the anchor point lies is also noted. In some cases, threshold 327 is programmable. Threshold value 380 may be calculated by averaging the Euclidean values 325 that first exceeded threshold 327 and the maximum value of the Euclidean value 325 before the end of the preamble was detected.

On subsequent passes (i.e., where retry number 125 indicates the second or later retry), the same process of establishing an anchor point may be used as it is repeatable. However, in some cases of the aforementioned embodiments, for subsequent retries threshold 327 may be programmed to be the same value as threshold value 380 such that the anchor point is indicated whenever threshold value 380 is again identified. In every retry pass, the search for anchor-point is done in the same quarter-rate phase 382 that was identified in the first pass.

Threshold 327 may be set originally by programming a default value, but then may be dynamically updated with every retry pass. In the first pass, the maximum value of Euclidean value 325 prior to end-of-preamble detection point is recorded into a register MAX_VALUE. In each subsequent retry pass, this register is updated with the new maximum Euclidean value 325 prior to the end-of-preamble detection point if the new maximum for this pass is bigger than the content of register MAX_VALUE. In the current pass, if Euclidean value 325 is greater than threshold value 380, threshold value 380 for the next retry is set as:

threshold value 380=(Euclidean Value 325+MAX VALUE)/2.

Based on the discussion of the various embodiments of the present invention as illustrated in FIG. 2 and FIG. 3, one of ordinary skill in the art will recognize that the anchor point detection circuits shown in FIG. 2 and FIG. 3 may successfully detect anchor point even in the absence of media defect in the input data. The actual data sync mark will cause the threshold test circuits 230 in FIGS. 2 and 330 in FIG. 3 to assert detection of end-of-preamble as a valid anchor point. While this happens by metric circuit Euclidean used in FIG. 2, it also happens in FIG. 3 since the 2T DFT value 215 over actual sync mark will be much less than that over 2T preamble pattern. Thus, the present invention can be used for location of anchor point whether or not media defect occurs.

Figure 4A:
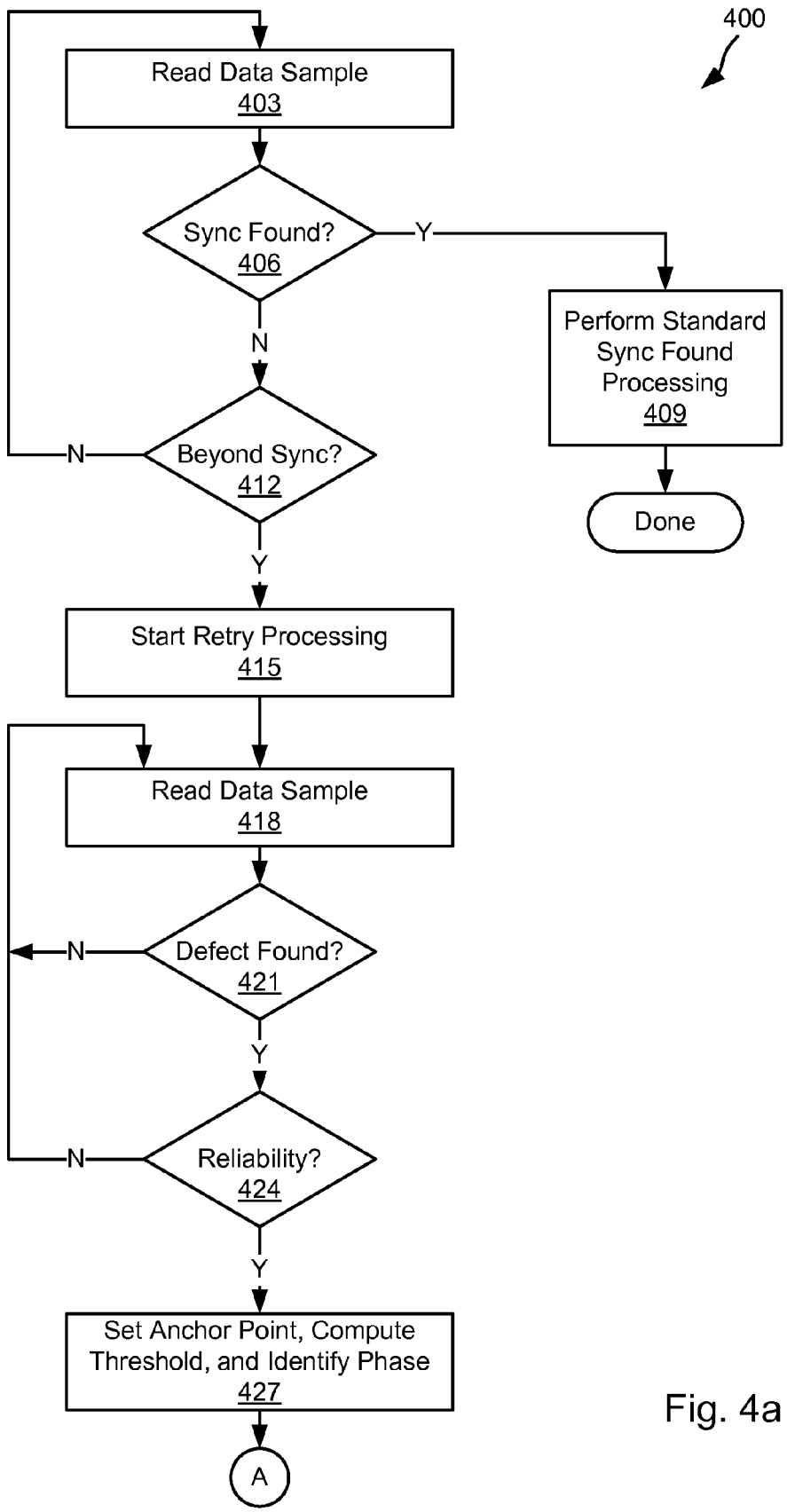
FIGS. 4a and 4b are flow diagrams showing a method in accordance with some embodiments of the present invention for fixing an anchor point and forcing a data sync mark relative to the anchor point in accordance with one or more embodiments of the present invention.
Figure 4B:
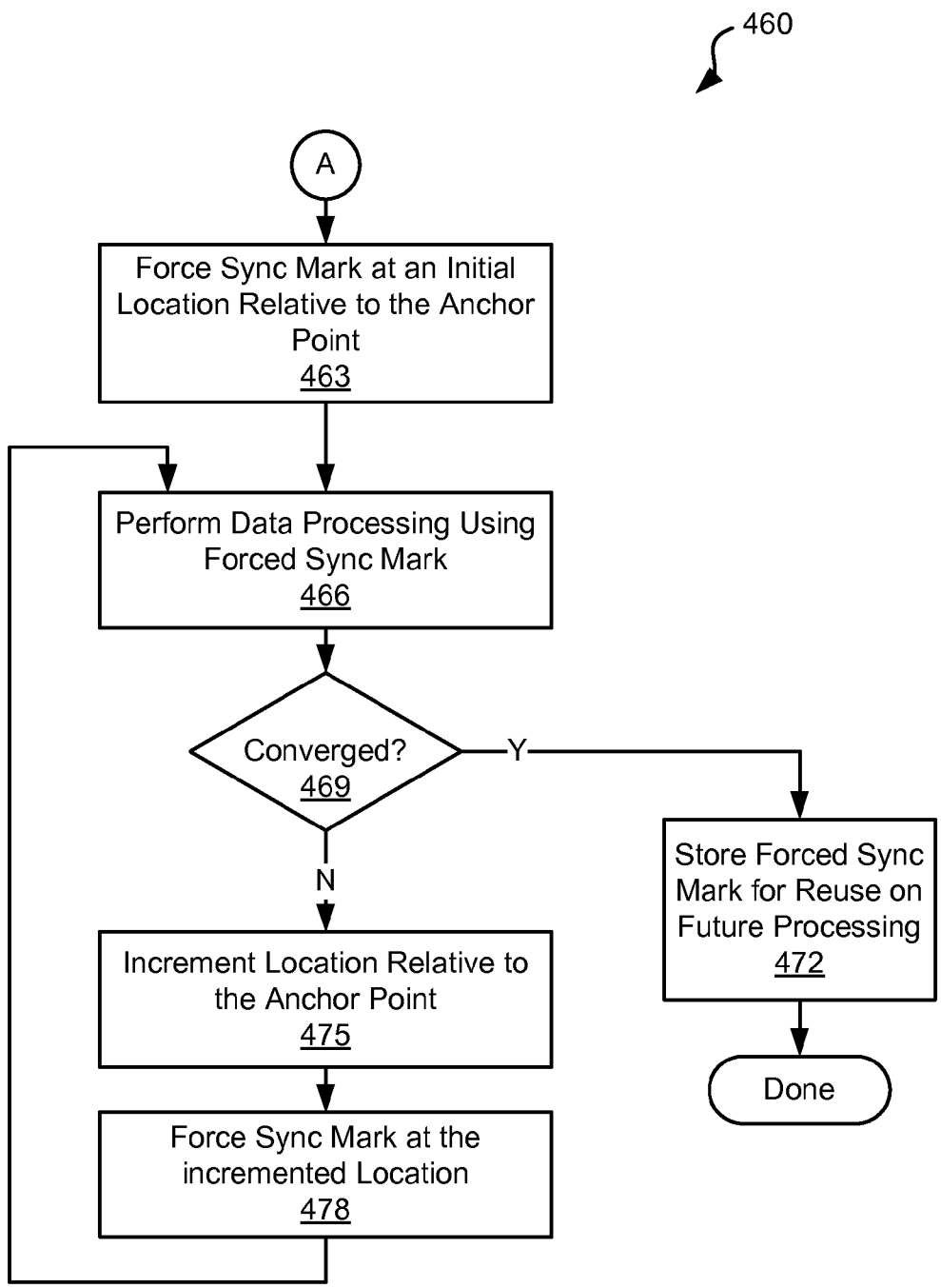

Turning to FIG. 4a and FIG. 4b, flow diagram 400 and flow diagram 460 show a method in accordance with some embodiments of the present invention for fixing an anchor point and forcing a data sync mark relative to the anchor point in accordance with one or more embodiments of the present invention. Following flow diagram 400, a data sample is read (block 403). The data sample may be a digital representation of information sensed from a storage medium. The data sample may be read either as a live data stream or from a buffer where a live data stream was previously buffered. The data sample is included in a larger series of data samples and compared to determine if an original sync mark has been identified (block 406). Where an original data sync mark is identified (block 406), standard processing is performed on the user data following the original data sync mark using the original data sync mark as an indication of where the codeword to be processed begins (block 409).

Alternatively, where an original data sync mark is not found (block 406), it is determined whether the search for the sync mark has already extended beyond where the sync mark would have been expected to be found (block 412). Where region where the sync mark was expected has not yet been passed (block 412), the process of searching for an original data sync mark is continued. Where, on the other hand it is determined that the region where the original data sync mark was expected has been passed (block 412), retry processing is started (block 415). Retry processing includes reading data samples from a buffer where they were stored during the original processing (block 418). These samples are provided to a defect detector circuit that processes the received data to determine whether a media defect is indicated (block 421). Where a defect is not found (block 421), the process of reading data samples and searching for a defect is continued. Alternatively, where a defect is found (block 421), the defect is tested to see if it is sufficiently reliable (i.e., exhibits monotonicity or passes a threshold test) (block 424). Where the defect is not found to be sufficiently reliable (block 421), the process of reading data samples and retesting for a defect and reliability is continued. Otherwise, where a defect is found to be sufficiently reliable (block 424), and anchor point (i.e., a location of the defect) is stored along with the phase of the sample where it was found (block 427) and a threshold is computed and stored for use in subsequent retry passes.

Following flow diagram 460, a sync mark is forced (i.e., forced sync mark) at an initial location relative to the previously determined anchor point (block 463). In some cases, this initial sync mark is forced at the same location as the anchor point. In other cases, the initial sync mark may be forced a reproducible distance from the anchor point. The data that follows the location of the forced sync mark is then processed using the forced sync mark as if it were an original data sync mark indicating the beginning of the user data (block 466). Such data processing may include, but is not limited to, low density parity check decoding and/or maximum a posteriori data detection as are known in the art. Based upon the disclosure provided herein, one of ordinary skill in the art will recognize various data processing approaches that may be applied to the read data.

It is determined whether the data processing converged (i.e., provided an expected result) (block 469). Where the data processing converged (block 469), the forced sync mark is assumed to be at the location of the original data sync mark and is stored for reuse on later accesses to the corresponding region of the media (block 472). Otherwise, where the data processing failed to converge (block 469), the location relative to the identified anchor point is incremented (block 475), and a sync mark is forced at the newly incremented location (block 478). This process of forcing sync marks continues until either a timeout condition is met or the data processing converges (block 469).

Figure 5:
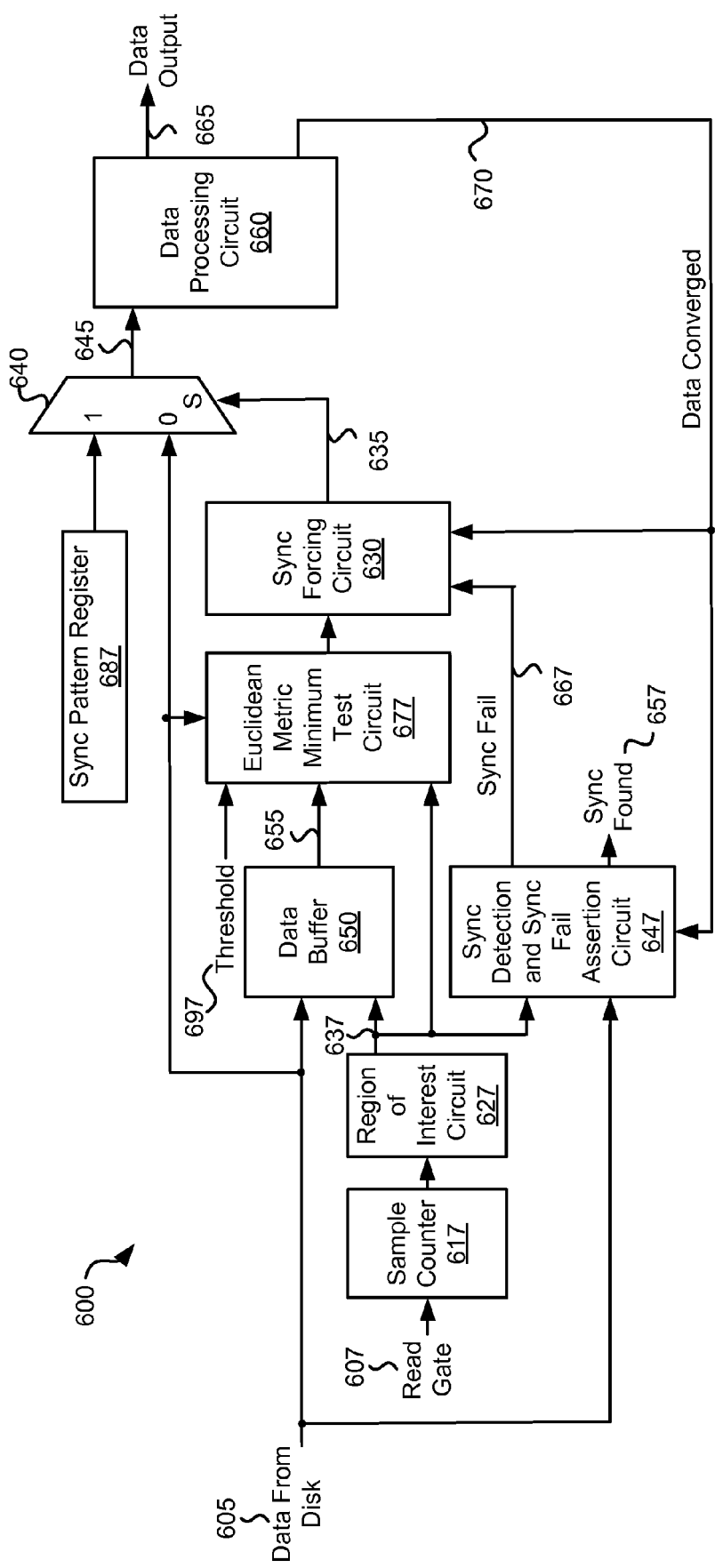
FIG. 5 shows a waveform comparison based anchor location circuit in accordance with some embodiments of the present invention.

Turning to FIG. 5, a waveform comparison based anchor location circuit 600 is shown in accordance with some embodiments of the present invention. Anchor location circuit 600 includes a sample counter circuit 617 that counts the number of samples received from the assertion of a read gate signal 607. Read gate signal 607 asserts to indicate that samples derived from a user data region of a sector are being received, and thus sample counter circuit 617 provides a count of which sample within a user data region is being processed. The count value from sample counter circuit 607 is provided to a region of interest circuit 627. Region of interest circuit 627 selects a window within the user data region where a sync mark is expected. The start of the window is a defined number of samples from the assertion of read gate signal 607, and extends for a defined number of samples. In some cases, the location of the start of the window is fixed and the length of the window is fixed. In other cases, both the location of the start of the window and the length of the window are programmable. In yet other cases, one of the location of the start of the window or the length of the window is programmable, and the other is programmable. When a count corresponding to a region within the window (i.e., the region of interest) is received from sample counter circuit 617, an active region signal 637 is asserted.

When active region signal 637 is asserted (indicating the region of interest is being processed), a data buffer 650 stores data 605 that is a series of digital samples that may be received, for example, from an analog processing circuit (not shown) that is responsible for sensing information from a storage medium, filtering the information, and converting the information to a series of corresponding digital samples. Based upon the disclosure provided herein, one of ordinary skill in the art will recognize a variety of sources for data 605 and pre-processing circuitry. As described below, the samples stored in data buffer 650 may be used at a later instant for purpose of identifying an anchor point.

In addition, data 605 is provided to a sync detection and sync fail assertion circuit 647. Circuit 647 compares the stream of received data with a defined sync mark pattern. When the sync mark pattern is identified within the region of interest (i.e., when active region signal 637 is asserted), a sync found signal 657 is asserted. Circuit 647 may use any sync mark detection process known in the art. Where sync found signal 657 is asserted, data 605 is provided to a data processing circuit 660 via an output 645 from a selector circuit 640.

Otherwise, where circuit 647 fails to identify a sync mark within the region of interest (i.e., before active region signal 637 is de-asserted), a sync fail signal 667 is asserted, and remains asserted until either a data convergence (i.e., as indicated by a data converged output 670 from data processing circuit 660) or a timeout condition is triggered. Also during the region of interest, a rolling comparison between the newly received data 605 and stored data 655 from a previous processing of the same sector is performed by a Euclidean metric minimum test circuit 677. In particular, Euclidean metric minimum test circuit 677 performs a process using the two data sources to determine a match value indicating a likelihood of a match between the currently received waveform and a previously received waveform in accordance with the following pseudocode:

```
For(i=0 to i=m)
{
    Match Value = ∑[k=0 to n] (X_segment[k] − Y_segment,i[k])²,
    If (|Match Value| < Threshold 697)
    {
        Set Anchor Point
    }
}
``` where $X_{segment}$ is an n bit segment of recently received data (i.e., n bits of data 605), $Y_{segment,i}$ is the $i^{th}$ n bit segment of stored data 655, and m corresponds to the length of the region of interest. The anchor point location is provided as an output to a sync forcing circuit 630 that selects a canned sync pattern from a sync pattern register 687 via selector circuit 640 by asserting a sync force output 635.

It should be noted that data processing circuit 660 may be any data processing circuit known in the art. As an example, data processing circuit 660 may include a sync mark detection circuit, timing and gain recovery loops, one or more data detector circuits, and one or more data decoder circuits. In such a situation, the sync mark detection process performed by sync detection and sync fail assertion circuit 647 may be performed by the sync mark detector circuit included as part of data processing circuit 660. Additionally, data processing circuit may identify a region of interest. In such a case, the circuitry in data processing circuit 660 may be used in place of sample counter circuit 617 and region of interest circuit 627.

In operation, where data processing fails to identify a sync mark during the region of interest, sync fail signal 667 is asserted. During this processing period, data 605 corresponding to the region of interest is stored to data buffer 650. Due to the failure, the data is re-read from the same sector to determine an anchor point location from which the data may be reprocessed. The data is re-read from the same sector and provided to Euclidean metric minimum test circuit 677. Euclidean test circuit 677 continuously calculates a Euclidean distance between a segment of data received as data 605 with different segments of stored data 655. For example, where the segment of data 605 is sixteen bits in length, a Euclidean distance between the sixteen bits of received data is calculated between bits one through sixteen of stored data 655, then between bits two through seventeen of stored data 655, the between bits three through eighteen of stored data and so on until a calculated Euclidean distance is less than a programmable threshold 697. The match where the threshold is met is considered an anchor point that is provided to sync forcing circuit 630. Sync forcing circuit 630 forces a sync mark at incrementing distances from the identified anchor point by selecting a sync pattern from a sync pattern register 687 via multiplexer 640. In this way, where a sync mark or a portion thereof was lost due to a media defect, the sync mark can be forced a multiple points relative a reproducible anchor location until either the data processing results in a converged sector, or until a timeout condition is achieved.

Figure 6A:
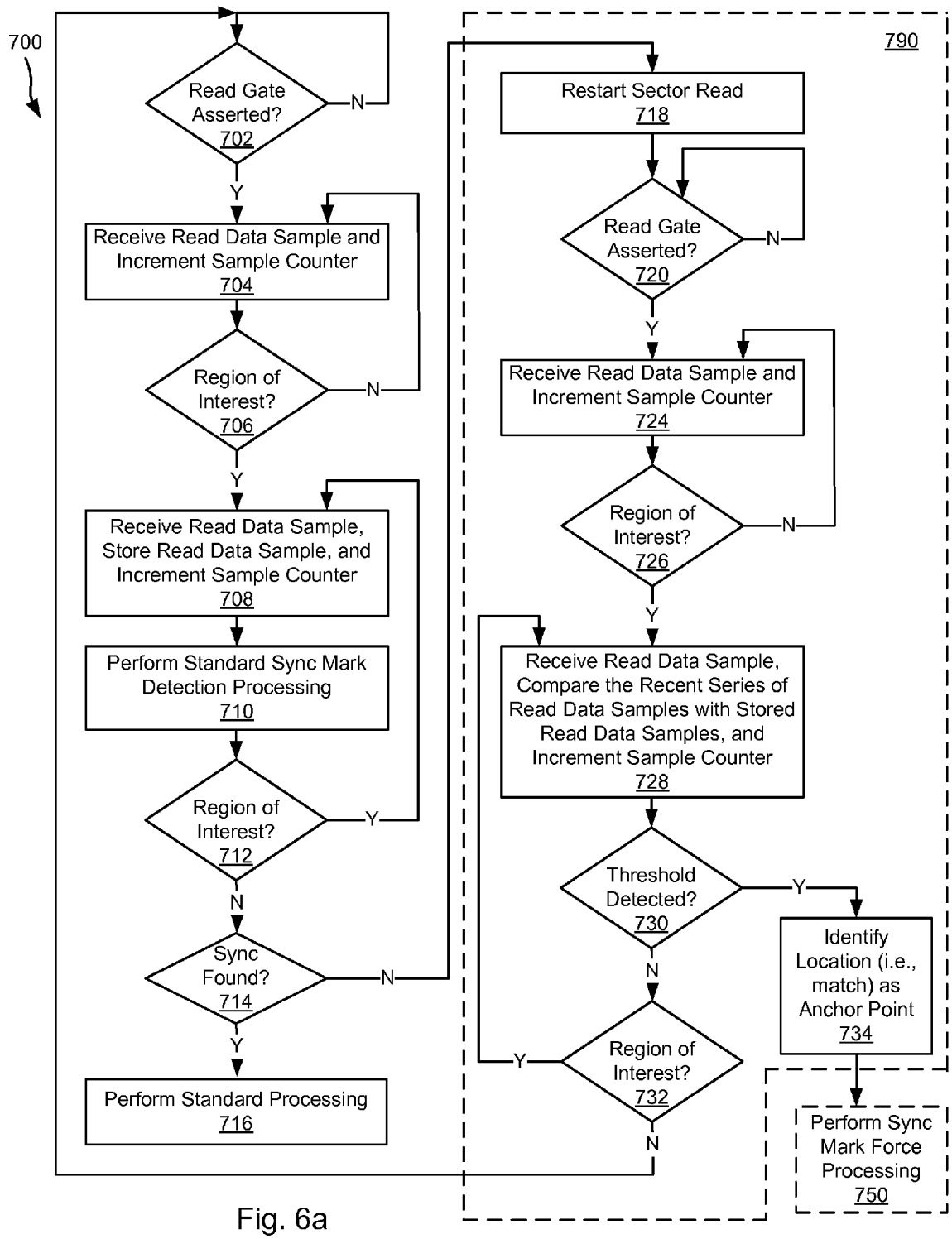
FIGS. 6a-6b are flow diagrams showing another method in accordance with some embodiments of the present invention for fixing an anchor point based upon a correlated waveform, and forcing a data sync mark relative to the anchor point in accordance with various embodiments of the present invention.
Figure 6B:
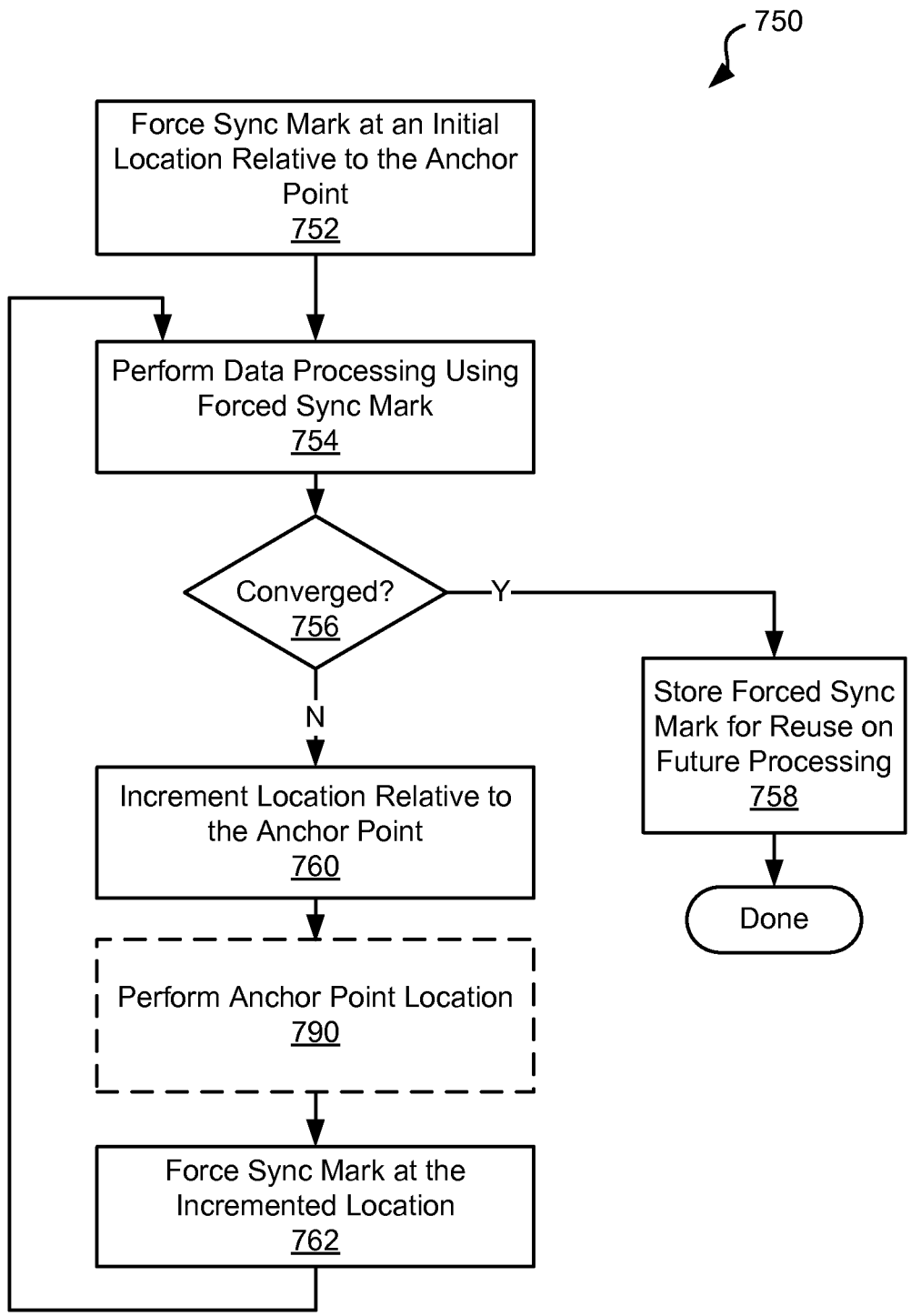

Turning to FIG. 6a and FIG. 6b, a flow diagram 700 and a flow diagram 750 show another method in accordance with some embodiments of the present invention for fixing an anchor point based upon a correlated waveform, and forcing a data sync mark relative to the anchor point in accordance with various embodiments of the present invention. Following flow diagram 700, it is determined whether a read gate is asserted (block 702). The read gate is a signal that when asserted indicates that data from a user data region of a storage medium is being received. In operation, the read gate includes various sources of jitter such that it is not always asserted at the exact beginning of the user data region. This jitter renders the read gate signal incapable of providing a repeatable anchor point by itself. Each data sample is received and a sample counter is incremented (block 704). The sample count indicates a distance or number of samples from assertion of the read gate signal.

A sync mark and other identification information is placed in a header of data at a defined location within the user data region. A window is opened (i.e., a region of interest) around an expected location of the header of data (block 706). Where the data being received is outside of the region of interest (block 706), additional samples are received and the sample counter is incremented (block 704). Otherwise, where the data received is within the region of interest (block 706), the received data samples from within the region of interest are received, stored, and the sample counter is incremented (block 708). The received data is queried to determine if a sync mark was included therein (block 710).

Once all data from the region of interest has been received and a sync mark was found (blocks 712, 714), the subsequent data is received and standard data processing is applied using the received sync mark information (block 716). Otherwise, where by the end of processing the data within the region interest a sync mark is not found (block 714), a process of identifying an anchor point is performed (block 790).

The process of identifying the anchor point (block 790) includes restarting a read of the same sector (block 718). This may include, for example, moving a read/write head assembly to a location relative to a storage medium where the sector of data is stored. As the data is received, the read gate is again asserted indicating the beginning of a user data region. Once the read gate is asserted (block 720), additional data samples are received and the sample counter is incremented indicating a distance or number of samples from the assertion of the read gate signal (block 724). This process of receiving samples and incrementing the sample counter continues until the region of interest begins (block 726).

Once the region of interest begins (block 726), the received data samples from within the region of interest are received, and the most recently received series of data samples is compared with the stored data samples corresponding to the previous processing of the region of interest (i.e., blocks 708-710), and the sample counter is incremented (block 728). The result of the comparison of the recently received data samples with the previously stored data samples is compared with a threshold value to determine whether a reasonable match has been identified (block 730). The match may and threshold comparison may be done in accordance with the following pseudocode:

```
For(i=0 to i=m)
{
```
$$\text{Match Value} = \sum_{k=0}^{n} (X_{segment}[k] - Y_{segment,i}[k])^2,$$
```
    If (|Match Value| < Threshold 697)
    {
            Set Anchor Point
    }
}
``` where $X_{segment}$ is an n bit segment of recently received data, $Y_{segment,i}$ is the $i^{th}$ n bit segment of the previously stored data, and m corresponds to the length of the region of interest.

This process of querying to determine a match between a portion of the received data and the previously stored data continues until the end of the region of interest (block 732). Where the processes of blocks 728, 730, 732 do not yield a match between the newly received data and the previously stored data after the end of the region of interest (block 732), the process is ended without identifying an anchor point. Alternatively, where the processes of blocks 728, 730, 732 yield a match between the newly received data and the previously stored data (block 730), the location of the match (i.e., the pattern that provides a match) is identified as an anchor point (block 734). This anchor point information is provided to perform forced sync mark processing (block 750).

Turning to FIG. 6b, a flow diagram shows details of the process of block 750. As shown, a sync mark is forced within the region of interest at an initial location (i.e., number of counts of the sample counter) relative to the identified anchor point (block 752). The forced anchor point is forced into a series of samples being forwarded to a downstream data processing circuit where a particular sync mark dependent data processing is applied (block 754). It is determined whether the data processing converged (block 756). Such convergence occurs where the data processing is able to resolve any errors in the received data set to restore the originally stored data. Where the data processing converged (block 756), it is assumed that the sync mark was forced at the correct location (otherwise it would be unlikely for the processing to converge due to the large number of errors caused by misplacement of the sync mark relative to the other data). Where convergence occurs (block 756), the location of the forced sync mark (i.e., number of counts of the sample counter relative to the anchor point) for reuse on subsequent reads of the particular sector (block 758).

Alternatively, where convergence does not occur (block 756) it is assumed that the sync mark was forced at the wrong point relative to the identified anchor point. In this case, the location relative to the anchor point is incremented (block 760). This is the location where the sync mark will be forced on the next pass. At this juncture, the process of identifying the anchor point (block 790) that was previously discussed is repeated. Once the anchor point is identified, the sync mark is forced at the incremented location relative to the anchor point (block 762). The process of data processing is repeated followed by determination of whether the data processing repeats (blocks 754, 756, 758, 760, 790, 762).

Figure 7:
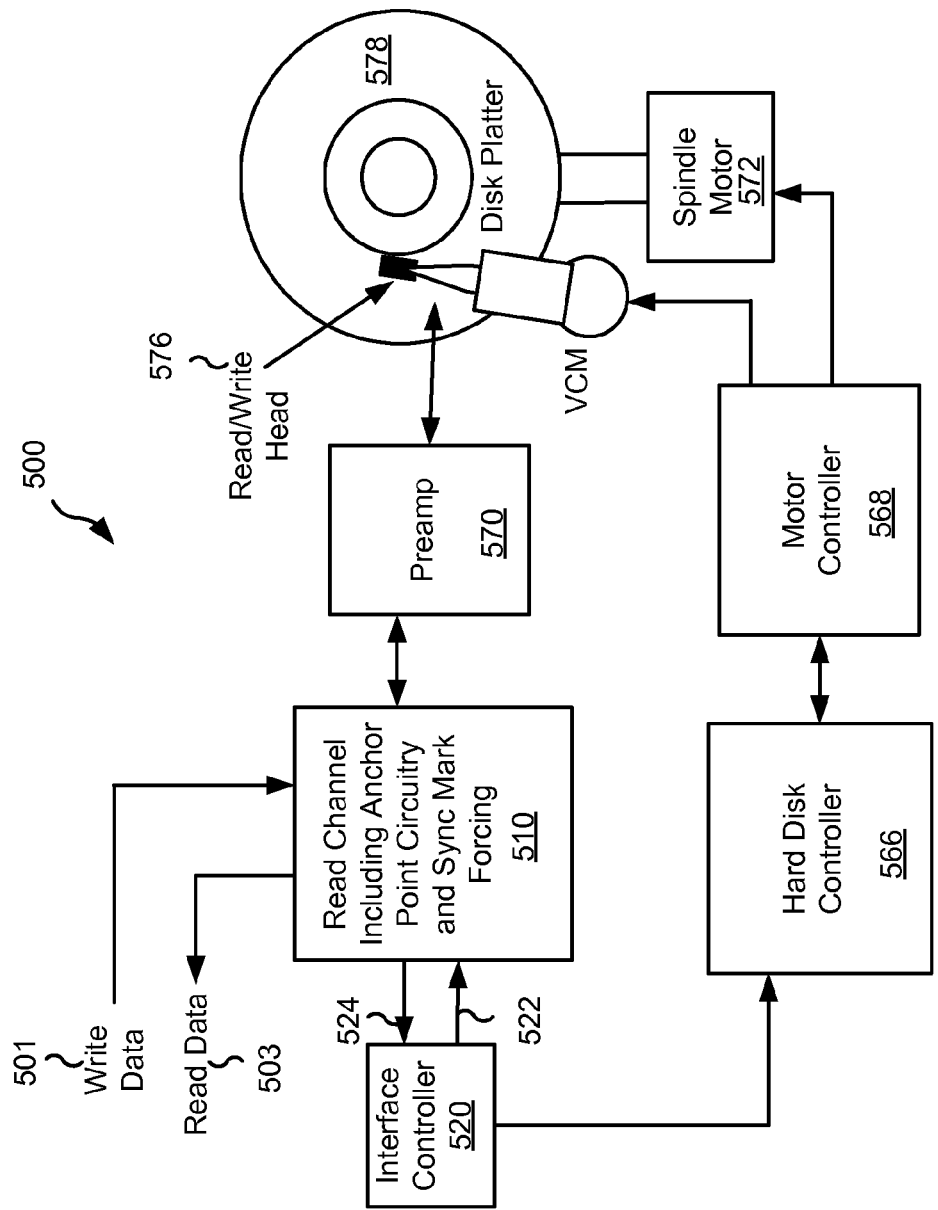
FIG. 7 depicts a storage system including a read channel with anchor point circuitry and sync mark forcing circuitry in accordance with some embodiments of the present invention.

Turning to FIG. 7, a storage system 500 including a read channel 510 with anchor point circuitry and sync mark forcing is shown in accordance with various embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and read/write heads 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 510 via preamplifier 570. Preamplifier 570 is operable to amplify the minute analog signals accessed from disk platter 578. In turn, read channel module 510 decodes and digitizes the received analog signal to recreate the information originally written to disk platter 578. This data is provided as read data 503 to a receiving circuit. A write operation is substantially the opposite of the preceding read operation with write data 501 being provided to read channel module 510. This data is then encoded and written to disk platter 578.

The anchor point circuitry and sync mark forcing circuitry may be similar to those discussed above in relation to FIG. 1-3 or 5, and/or may operate similar to that discussed above in relation to FIGS. 4a-4b or 6a-6b. Such anchor point circuitry and sync mark forcing circuitry are capable of identifying a reproducible location on a medium, and forcing a sync mark at a location relative to the reproducible location as described herein.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for identifying a reproducible location on a storage medium. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A circuit for identifying a reproducible location on a storage medium, the circuit comprising:
    a data storage circuit operable to store a first set of data samples derived from a region of interest;
    a pattern comparison circuit operable to compare a subset of the first set of data samples with a subset of a second set of data samples derived from the region of interest, and wherein the pattern comparison circuit is operable to yield a match value corresponding to a degree of similarity between the first set of data samples with the subset of a second set of data samples; and
    a threshold comparison circuit operable to indicate an anchor point based at least in part on the magnitude of the match value relative to a threshold value.

2. The circuit of claim 1, wherein the threshold value is programmable.

3. The circuit of claim 1, wherein the pattern comparison circuit calculates a Euclidean distance between the subset of the first set of data samples and the subset of a second set of data samples.

4. The circuit of claim 3, wherein the Euclidean distance is calculated consistent with the following equation:

$$\text{Match Value} = \sum_{k=0}^{n} (X_{segment}[k] - Y_{segment}[k])^2,$$

wherein the subset of the first set of data samples is n bits in length, wherein is the subset of the first set of data samples, and wherein is the subset of the second set of data samples.

5. The circuit of claim 1, wherein the circuit further comprises:
    a data processing circuit, wherein the data processing circuit is operable to process a sector of data samples using a forced sync mark that is a fixed distance from the anchor point.

6. The circuit of claim 5, wherein the circuit further comprises:
    a sync forcing circuit, wherein the sync forcing circuit is operable to repeatedly identify forced sync marks whenever the data processing circuit fails to converge, and to store the forced sync mark when the data processing circuit converges.

7. The circuit of claim 6, wherein the circuit further comprises:
    a storage medium maintaining the sector of data samples, and wherein the sector of data samples includes the first set of data samples; and
    a data buffer operable to store the forced sync mark that is usable on subsequent reads from the storage medium to indicate the beginning of a decodable data set on the storage medium.

8. The circuit of claim 1, wherein the circuit is implemented as part of an integrated circuit.

9. A method for identifying a reproducible location on a storage medium, the method comprising:
    receiving a series of data samples derived from a storage medium;
    storing a first subset of the data samples to a memory, wherein the first set of data samples corresponds to a region of interest;
    comparing a second subset of the data samples with the first subset of the data samples to yield a match value corresponding to a degree of similarity between the first subset of the data samples and the second subset of the data samples, and wherein the second subset of the data samples corresponding to at least a portion of the region of interest; and
    identifying an anchor point on the storage medium based at least in part on the match value.

10. The method of claim 9, wherein identifying the anchor point includes comparing the match value with a threshold value, and wherein the anchor point corresponds to the pattern in the first subset of the data samples where the match value is less than the threshold value.

11. The method of claim 10, wherein the method further comprises:
    programming the threshold value.

12. The method of claim 9, wherein the method further comprises:
    applying a data processing algorithm to the series of data samples using the anchor point as a reference for the beginning of a decodable data set.

13. The method of claim 12, wherein the data processing algorithm converges, and wherein the method further comprises:
    storing a forced sync mark in a memory, wherein the forced sync mark indicates a location relative to the anchor point that is usable on subsequent reads from the storage medium to indicate the beginning of a decodable data set on the storage medium.

14. The method of claim 12, wherein the data processing algorithm includes a low density parity check algorithm.

15. The method of claim 14, wherein the data processing algorithm includes a data detection algorithm.

16. The method of claim 15, wherein the data detection algorithm is selected from a group consisting of: a Viterbi algorithm detection process and a maximum a posteriori algorithm process.

17. The method of claim 9, wherein the method further comprises:
  accessing information from the storage medium; and
  generating the series of data samples based upon the information.

18. A hard disk drive system, the hard disk drive system comprising:
  a storage medium;
  a data storage circuit operable to store a first set of data samples corresponding to a region of interest;
  a pattern comparison circuit operable to compare a subset of the first set of data samples with a subset of a second set of data samples corresponding to the region of interest, and wherein the pattern comparison circuit yields a match value corresponding to a degree of similarity between the first set of data samples with the subset of a second set of data samples derived from the region of interest; and
  a threshold comparison circuit operable to indicate an anchor point based at least in part on the magnitude of the match value relative to a threshold value.

19. The system of claim 18, wherein the pattern comparison circuit calculates a Euclidean distance between the subset of the first set of data samples and the subset of a second set of data samples.

20. The system of claim 18, wherein the system further comprises:
  a data processing circuit, wherein the data processing circuit is operable to process a sector of data samples using a forced sync mark that is a fixed distance from the anchor point.

21. The system of claim 20, wherein the system further comprises:
  a sync forcing circuit operable to repeatedly identify forced sync marks whenever the data processing circuit fails to converge, and to store the forced sync mark when the data processing circuit converges; and
  a data buffer operable to store the forced sync mark that is usable on subsequent reads from the storage medium to indicate the beginning of a decodable data set on the storage medium.

* * * * *